US007897325B2

(12) United States Patent
Sawada et al.

(10) Patent No.: US 7,897,325 B2
(45) Date of Patent: Mar. 1, 2011

(54) LITHOGRAPHIC RINSE SOLUTION AND METHOD FOR FORMING PATTERNED RESIST LAYER USING THE SAME

(75) Inventors: Yoshihiro Sawada, Kawasaki (JP); Jun Koshiyama, Kawasaki (JP); Kazumasa Wakiya, Kawasaki (JP); Atsushi Miyamoto, Kawasaki (JP); Hidekazu Tajima, Kawasaki (JP)

(73) Assignee: Tokyo Ohka Kogyo Co., Ltd., Kanagawa-Ken (JP)

( * ) Notice: Subject to any disclaimer, the term of this patent is extended or adjusted under 35 U.S.C. 154(b) by 631 days.

(21) Appl. No.: 11/296,343

(22) Filed: Dec. 8, 2005

(65) Prior Publication Data

US 2006/0128581 A1 Jun. 15, 2006

(30) Foreign Application Priority Data

Dec. 9, 2004 (JP) ............................ 2004-357460

(51) Int. Cl.
*G03F 7/26* (2006.01)
*G03F 7/40* (2006.01)
*C11D 7/04* (2006.01)

(52) U.S. Cl. ....................... 430/331; 430/322; 430/330; 430/432; 510/178

(58) Field of Classification Search .............. 430/270.1, 430/401, 325, 331, 322, 330; 252/79.4; 134/2; 548/215, 235, 240, 255; 510/178
See application file for complete search history.

(56) References Cited

U.S. PATENT DOCUMENTS

| | | | | |
|---|---|---|---|---|
| 4,171,974 | A * | 10/1979 | Golda et al. | 430/278.1 |
| 4,374,744 | A * | 2/1983 | Kawanabe et al. | 252/79.4 |
| 4,704,234 | A * | 11/1987 | Petersen et al. | 510/418 |
| 5,236,746 | A * | 8/1993 | Kapp-Schwoerer et al. | 427/508 |
| 5,489,433 | A * | 2/1996 | Aboud | 424/405 |
| 5,849,467 | A | 12/1998 | Sato et al. | 430/327 |
| 6,100,315 | A * | 8/2000 | Kitamura et al. | 523/160 |
| 6,225,030 | B1 * | 5/2001 | Tanabe et al. | 430/313 |
| 6,472,127 | B1 * | 10/2002 | Takizawa | 430/322 |
| 2001/0038976 | A1 * | 11/2001 | Tanabe et al. | 430/325 |
| 2002/0045133 | A1 | 4/2002 | Maemori et al. | 430/270 |
| 2004/0018453 | A1 * | 1/2004 | Anzures et al. | 430/401 |
| 2004/0067615 | A1 | 4/2004 | Maemori et al. | 438/200 |
| 2005/0181609 | A1 * | 8/2005 | Kurata et al. | 438/689 |
| 2005/0284502 | A1 * | 12/2005 | Watanabe et al. | 134/2 |
| 2006/0124586 | A1 * | 6/2006 | Kobayashi et al. | 216/41 |
| 2007/0167343 | A1 | 7/2007 | Suzuki et al. | 510/329 |

FOREIGN PATENT DOCUMENTS

| | | | | |
|---|---|---|---|---|
| EP | 1338923 | | * | 8/2003 |
| EP | 1 580 606 | A1 | | 9/2005 |
| JP | 07-142349 | | * | 6/1995 |
| JP | 11-295902 | | | 10/1999 |
| JP | 2001-23893 | | | 1/2001 |
| JP | 2001-159824 | | | 6/2001 |
| JP | 2002-148816 | | | 5/2002 |
| JP | 2002-323774 | | | 11/2002 |
| JP | 2004-184648 | | | 7/2004 |
| KR | 10-0230687 | | | 8/1999 |
| KR | 10-0361481 | | | 6/2002 |
| KR | 2002049448 | A | * | 6/2002 |
| KR | 10-2006-0049679 | | | 5/2006 |
| KR | 10-2007-0054709 | | | 5/2007 |
| WO | WO 91/05289 | | * | 4/1991 |
| WO | WO 03/094216 | | * | 11/2003 |
| WO | WO 2004/051379 | | * | 6/2004 |

* cited by examiner

*Primary Examiner*—Cynthia H Kelly
*Assistant Examiner*—Anca Eoff
(74) *Attorney, Agent, or Firm*—Wenderoth, Lind & Ponack LLP.

(57) ABSTRACT

The invention provides a novel rinse solution used in the step of rinse treatment of a patterned photoresist layer developed with an aqueous alkaline developer solution in a photolithographic process for the manufacture of semiconductor devices and liquid crystal display panels. The rinse solution provided by the invention is an aqueous solution of a nitrogen-containing heterocyclic compound such as imidazoline, pyridine and the like in a concentration up to 10% by mass. Optionally, the rinse solution of the invention further contains a water-miscible alcoholic or glycolic organic solvent and/or a water-soluble resin. The invention also provides a lithographic method for the formation of a patterned photoresist layer including a step of rinse treatment of an alkali-developed resist layer with the rinse solution defined above. The invention provides an improvement on the lithographic process in respect of the product quality and efficiency of the process.

8 Claims, No Drawings

LITHOGRAPHIC RINSE SOLUTION AND METHOD FOR FORMING PATTERNED RESIST LAYER USING THE SAME

BACKGROUND OF THE INVENTION

The present invention relates to a novel lithographic rinse solution that decreases defects and pattern-falling, when used for rinsing the photoresist after the image-forming light-exposure and the development, and is effective for shortening rinsing treatment time by improving a draining speed, and relates to a method for forming a patterned resist layer by using the lithographic rinse solution.

In recent years, a light source for fine working has been changing to a shorter wavelength capable of forming a higher-resolution patterned resist layer with the compactness and integration of semiconductor devices; specifically, changing from ordinary ultraviolet light to the g-line (436 nm), from the g-line to the i-line (365 nm), from the i-line to KrF excimer laser beams (248 nm); and currently, to ArF excimer laser beams (193 nm), $F_2$ excimer laser beams (157 nm), and further to electron beams such as EB and EUV, which now have become the major current. In order to follow up the trend, a process and photoresist material compliable with these short-wavelength light sources are under development at a fast pace.

Conventional photoresists are required to have; for instance, satisfactory sensitivity, pattern resolution, heat resistance, focusing depth latitude; an improved cross sectional profile of a patterned resist layer resulting therefrom; improved aging stability after having been coated resulting in the deterioration of the shape of the patterned resist layer due to contamination with amine and the like in a period between the steps of light exposure and post-exposure baking (PEB); and substrate dependency, which means the phenomenon that changes are caused in the cross sectional profile of the patterned resist layer depending on various coating films on the silicon wafer such as an insulating film including silicon nitride (SiN) films, semiconductor films including polycrystalline silicon (poly-Si) films and metallic films including titanium nitride (TiN) films. These requirements have been solved to some extent, but a defect which is a particularly important issue has many problems remaining unsolved.

The defect means a mismatch between a patterned resist layer and a patterned photomask, which is detected when a patterned resist layer after having been developed is examined from right above with a surface defect observation instrument, for instance, the mismatch like a difference between shapes of the resist patterns, occurrence of scums and contaminants, irregular coloring and coalescence between the patterns. The yield of the semiconductor devices decreases as the number of defects increases so that, even through the photoresist has the adequate resist characteristics as described above, defects make it difficult for the semiconductor devices to be mass produced, while the problems thereof remain unsolved.

Various causes for the defect can be considered, some of which are the production of microbubbles in the developing step, and the re-deposition in the rinsing step of once removed insoluble substance.

As a method for decreasing such a defect, an improving method of changing the composition itself of a positive-working resist used in pattern formation (JP2002-148816A) is proposed, but such a change of the composition is not preferable because the process itself need be changed.

A method of applying a compound containing a hydrophobic group and a hydrophilic group, which is a surface active agent, in the formation of the patterned resist layer is also proposed (JP2001-23893A), but the method has a problem of making the top of the patterned resist layer round to lower the orthogonality in the cross sectional profile, and further of film thickness reduction of the resist layer during the treatment. Besides, the method has to select a surface active agent so as to match a resist to be used, which makes an operation complicated, because a semiconductor manufacturing plant supplies a developer solution used for development treatment usually through a collective pipeline, accordingly, when using various resists, it is necessary to change the treatment agent in correspondence to each resist, and to clean the inside of the pipeline after each run. Consequently, the above-described method is unsuitable for a practical application.

Furthermore, a method of reducing the defects by using a developer solution containing an organic base with no metallic ions and a nonionic surface active agent as the main component, in a development step of photolithography (JP2001-159824A), and a method of reducing the defects by treating the exposed photoresist layer before post-exposure baking treatment, with the use of an aqueous solution having a pH of 3.5 or lower which contains low-volatile aromatic sulfonic acid with a molecular weight of 200 or more (JP2002-323774A), are known but show no sufficient effects.

On the other hand, a method of using the composition of a rinsing agent containing a nitrogen-containing compound with a molecular weight of 45 to 10,000, which has an amino group or an imino group, and a hydrocarbon group with 1 to 20 carbon atoms in the molecule, so as to inhibit falling and damage of a patterned resist layer occurring in a rinsing step and a drying step (JP11-295902A) is also known, but the method of using such a composition of a rinsing agent cannot reduce the above-described defect. Besides, a rinse solution containing an ethylene oxide-based or propylene oxide-based surfactant (JP2004-184648A) is known, but such a rinse solution cannot inhibit a pattern falling because the hydrophilic group has weak interaction with water.

SUMMARY OF THE INVENTION

The present invention has been made with an object, under these circumstances, to provide a rinse solution which is effective, when a patterned photoresist layer is formed with the use of a lithographic technology, for improving the yield of the product, by decreasing the surface defect of a product, so-called a defect, by inhibiting pattern-falling in rinse with water and by imparting the patterned photoresist layer resistance to irradiation with an electron beam to prevent the shrinkage of the pattern, and which can increase production efficiency by promoting draining.

The inventors have conducted extensive investigations on a rinse solution used for forming a patterned resist layer with a lithographic technology and have arrived at a discovery that the above-described various drawbacks occurring when having used a conventional rinse solution can be overcome by having a water-soluble nitrogen-containing heterocyclic compound contained in the rinse solution, thus leading to completion of the present invention on the base of this discovery.

Namely, the present invention provides a lithographic rinse solution which is an aqueous solution of a water-soluble nitrogen-containing heterocyclic compound as well as a method for the formation of a patterned resist layer on a substrate, which comprises the successive steps of:

(A) forming a layer of a photoresist composition on the surface of the substrate;

(B) selectively exposing the photoresist layer to actinic rays through a patterned photomask;

(C) subjecting the photoresist layer exposed to actinic rays to a post-exposure baking treatment (hereafter called PEB treatment);

(D) developing the photoresist layer after the PEB treatment with an aqueous alkaline developer solution; and (E) rinsing the alkali-developed photoresist layer with the lithographic rinse solution.

DETAILED DESCRIPTION OF THE PREFFERRED EMBODIMENTS

In the next place, the present invention will be described further in detail.

A lithographic rinse solution according to the present invention needs to contain a water-soluble nitrogen-containing heterocyclic compound, and the water-soluble nitrogen-containing heterocyclic compound is preferably a compound represented by the general formula (I)

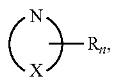

wherein X is a ring-forming member capable of forming a five- or six-membered heterocyclic ring or a five- or six-membered heterocyclic ring having a condensed ring together with the nitrogen atom N, R is an atom or group selected from the group consisting of halogen atoms, lower alkyl groups, lower alkoxy groups, hydroxyl group and substituted or unsubstituted amino groups and n is 0 or a positive integer not exceeding 3. In the formula, X may include a nitrogen atom, an oxygen atom and a sulfur atom.

Such a compound is preferably selected, for instance, from the group consisting of pyrrole, thiazole, oxazole, imidazoline, imidazole, pyridine, pyrazine, pyrimidine, pyridazine, piperazine, indole, isoindole, quinoline, triazole and partial hydrogenation products thereof, or a substituted compound therefrom.

The halogen atom in the above given general formula includes, for instance, atoms of fluorine and chlorine; the lower alkyl group includes, for instance, a methyl group and an ethyl group; the lower alkoxy group includes, for instance, a methoxy group and an ethoxy group; and the substituted amino group includes, for instance, a primary amino group or secondary amino group having an alkyl group with 1 to 4 carbon atoms as a N-substituent.

The above-described water-soluble nitrogen-containing heterocyclic compound includes not only an aromatic heterocyclic compound having a heterocycle in a completely unsaturated state, but also a compound having the heterocycle completely or partially hydrogenated, or an oxo compound thereof.

Accordingly, the water-soluble nitrogen-containing heterocyclic compound preferably used in the present invention includes, for instance, imidazolidinone, 2,5-dimethylpiperazine, 2,6-dimethylpiperazine, 3-chloropyridine, 4-chloropyridine, cyanuric chloride, 2,5-dimethylpiperidine, 3,5-dimethylpyrazole, 2-piperidone, 3-pyridinol, pyridylamine, methylpiperidine, methylpyridine, methoxypyridine, pyrazolone and quinolylamine.

These water-soluble nitrogen-containing heterocyclic compounds can be used singly or as a combination of two kinds or more.

The lithographic rinse solution according to the present invention is prepared by dissolving the above-described water-soluble nitrogen-containing heterocyclic compound in an aqueous solvent, or equivalently, water alone or a mixed solvent of water and a water-miscible organic solvent.

The above-described water-miscible organic solvent to be used includes an alcoholic solvent such as methanol, ethanol, isopropanol and propanol, or a glycolic solvent such as ethyleneglycol, propyleneglycol and diethyleneglycol. The content proportion of the water-miscible organic solvent is in the range suitably from 0.01 to 10% by mass or, preferably, from 0.1 to 5% by mass, based on the amount of water.

In addition, the concentration of the water-soluble nitrogen-containing heterocyclic compound in a lithographic rinse solution according to the present invention is in the range suitably from 0.1 ppm by mass to 10% by mass, preferably, from 5 ppm by mass to 3% by mass or, particularly, from 10 ppm by mass to 1% by mass, based on the overall amount of the rinse solution.

The lithographic rinse solution according to the present invention is further admixed with a water-soluble resin, according to need. The water-soluble resin includes, for instance, a homopolymer or a copolymer of a monomer or monomers selected from the group consisting of vinyl acetamide, (meth)acrylamide, methyl(meth)acrylamide, ethyl (meth)acrylamide, propyl(meth)acrylamide, dimethylaminoethyl(meth)acrylamide, dimethylaminopropyl(meth) acrylate, quaternized dimethylaminoethyl(meth)acrylate, vinylimidazole, vinyl imidazoline, vinylpyridine, vinylpyrrolidone, vinyl morpholine and vinyl caprolactam. In addition, vinyl acetate-based polymers and hydrolysates of vinyl acetate and other copolymer(s) can also be used as the water-soluble resin.

The homopolymer or copolymer has a mass average molecular weight in the range between 500 and 1,500,000 or, preferably, between 1,000 and 50,000.

The concentration of the water-soluble resin is selected from the range of 0.1 ppm by mass to 10% by mass or, preferably, 0.5 ppm by mass to 5% by mass, based on the overall amount of the rinse solution.

The lithographic rinse solution of the present invention is furthermore admixed with an acidic substance or an alkaline substance in order to improve further storage stability, and an anionic surface active agent or a nonionic surface active agent in order to improve coating characteristics.

The above-described acidic substance includes formic acid, acetic acid, propionic acid, butyric acid, isobutyric acid, glycolic acid, oxalic acid, fumaric acid, maleic acid, phthalic acid, peracetic acid, sulfuric acid, trifluoroacetic acid and ascorbic acid. The pH of the acidic solution is preferably controlled to 6 or lower.

The above-described alkaline substance is preferably an organic base such as organic amine and quaternary ammonium hydroxide. The organic amine includes monoethanolamine and 2-amino ethoxyethanol; and the quaternary ammonium hydroxide includes tetramethylammonium hydroxide, tetraethylammonium hydroxide, 2-hydroxyethyl trimethylammonium hydroxide, tetrapropylammonium hydroxide, methyl tripropylammonium hydroxide, tetrabutylammonium hydroxide and methyl tributyl ammonium hydroxide. The pH of the alkaline solution is preferably controlled to 8 or higher.

The above-described anionic surface active agent to be used includes, for instance, an N-higher alkyl pyrrolidone and a quaternary ammonium salt of a higher alkyl benzil; the above-described nonionic surface active agent to be used includes a condensate of a higher fatty acid poly(ethylene oxide), of which at least one alkylene oxide compound selected from the group consisting of a polyoxyalkylene glycol and a monoalkyl ether thereof is particularly preferable. These surface active agents are used in a concentration of 0.001 to 0.5% by mass, or preferably, 0.005 to 0.1% by mass, based on the total amount of the lithographic rinse solution.

A method for the formation of a patterned resist layer on a substrate with the use of a lithographic rinse solution according to the present invention comprises the successive steps of:

(A) forming a layer of a photoresist composition on the surface of the substrate;

(B) selectively exposing the photoresist layer to actinic rays through a patterned photomask;

(C) subjecting the photoresist layer exposed to actinic rays to a PEB treatment;

(D) developing the photoresist layer after the PEB treatment with an aqueous alkaline developer solution; and (E) rinsing the alkali-developed photoresist layer with the lithographic rinse solution.

The above-described step (A) is a step for forming a photoresist film on a substrate. A silicon wafer is usually used as a substrate material, and in addition to this, a material known as the substrate for a semiconductor device, such as aluminum, a titanium-tungsten alloy, an aluminum-silicon alloy, an aluminum-copper-silicon alloy, silicon oxide and silicon nitride, can be arbitrarily selected and used.

A photoresist film is provided on the substrate by applying, for instance, a solution of a chemical-amplification photoresist composition which is generally used in a production process for a semiconductor device, with a spinner and the like, so that the photoresist film has a thickness of 0.5 to 10 μm as dried.

In step (A), the thus prepared coating solution is applied onto a substrate, and then, is pre-baked at 70 to 150° C. for 30 to 150 seconds.

Subsequently, in step (B), a latent image is formed on a photoresist film formed in the step (A) by selectively light-exposing the photoresist film to actinic rays through a patterned photomask. The light-exposure treatment is performed by irradiating the photoresist film with actinic rays such as ArF excimer laser beams and KrF excimer laser beams.

In step (C), the photoresist layer having the latent image formed thereon by irradiation with actinic rays in the above-described step (B) is subjected to a PEB treatment. The treatment is usually performed at about 70 to 150° C. for 30 to 150 seconds.

Subsequently, the thus PEB-treated photoresist film is alkali-developed in step (D) according to a conventional method.

As a developer solution for the alkali development, an aqueous solution of a tetraalkylammonium hydroxide or, preferably, tetramethylammonium hydroxide is used. The concentration is selected in the range from 1 to 5% by mass or, preferably, 2 to 3% by mass. The optimal concentration is in the vicinity of 2.38% by mass. A treatment temperature is usually room temperature, for instance, in the range of 10 to 30° C. or, more preferably, 23° C.

In step (E), the photoresist film developed in the step (D) is treated with the above-described lithographic rinse solution. The treatment is performed by dipping the substrate bearing the patterned resist layer formed by development into the rinse solution, or by applying or spraying the rinse solution onto the surface of the patterned resist layer, and in order to have a high throughput, an coating method such as, for instance, a spin-coating method is advantageous in respect of unnecessity of a new step within the production line of semiconductor devices.

The treatment using the lithographic rinse solution according to the present invention prevents re-deposition of a polymer which is dissolved into a developer solution and removed from a substrate in a developing step, and consequently can reduce the defect of a patterned resist layer to be obtained.

Usually, a semiconductor device is mass-produced and a throughput becomes an important condition, so that the treatment period of time is preferably minimized, and accordingly is selected in the range of 1 to 30 seconds.

In the method according to the present invention, it is advantageous to employ the above-described fluorine- and nitrogen-containing heterocyclic compound as a water-soluble nitrogen-containing heterocyclic compound to be contained in a rinse solution, because the rinse solution can further shorten the above-described treatment period of time.

Namely, when a substrate is rinsed with a lithographic rinse solution containing a fluorine- and nitrogen-containing heterocyclic compound, the substrate can be rinsed with improved water dissipation, or equivalently, the improved draining of water, in a subsequent rinsing step with the use of pure water. When the content of the fluorine- and nitrogen-containing heterocyclic compound in this rinse solution is reasonably increased, it is possible to decrease the drain-off rime to about 3 seconds or, namely, to about one third as compared with that, i.e. about 10 seconds when a different water-soluble nitrogen-containing heterocyclic compound is used.

The method according to the present invention can further add a rinsing step (F) with the use of pure water after the step (E), according to desire.

One of defects is caused by a phenomenon that when a patterned resist layer is usually formed, an alkali-soluble component in a photoresist composition precipitates during rinse with water after alkali development, and attaches to the surface of a photoresist layer after the patterned resist layer has been formed. However, it is presumable in the method of the present invention that the re-deposition based defects are remarkably decreased because the surface of the patterned resist layer is rendered hydrophilic by treating with the inventive lithographic rinse solution after development so that a re-deposition of an alkali-dissolved matter onto the photoresist, to the surface of the patterned resist layer can be prevented.

An advantage is obtained that, when the patterned resist layer substrate treated in the inventive method is further treated with a rinse solution containing a fluorine compound soluble in alcoholic solvents such as, for instance, a water-soluble fluorocarbon compound, pattern falling can be efficiently prevented to give a high-quality product.

In the next place, a best mode for carrying out the present invention will be described by way of Examples, but the present invention is not limited by these examples.

Physical values in the respective Examples were measured by the following methods.

(1) Reduced Ratio of the Number of Defects

The number (A) of defects and the number (B) of the defects were measured with a surface defect observation instrument (Model "KLA-2351", manufactured by KLA-Tencor Corporation), respectively on patterned resist layers rinsed with each rinse solution sample and on a patterned resist layer rinsed with pure water alone, and the reduced ratio was expressed by a percentage (%) of the number (A) with respect to the number (B), or namely, $(A/B)\times100$.

(2) Draining Period of Time

Each sample was prepared by applying a positive-working photoresist ("TARF-P6111", a product of Tokyo Ohka Kogyo Co.) onto an 8-inch silicon wafer, into a film thickness of 180 nm; treating it with a 2.38% by mass aqueous solution of tetramethylammonium hydroxide (at a solution temperature of 23° C.) for 60 seconds, without light-exposure; applying a rinse solution for the test onto the surface of the positive-working photoresist at 2,000 rpm for six seconds; and further applying pure water onto the surface at 500 rpm for three seconds. The draining period of time was expressed by seconds, which were necessary to completely drain water at 1,000 rpm.

(3) Electron-Beam Resistance

The electron-beam resistance was expressed by a line width which was measured after forming a line with a width of 130 nm on a silicon substrate and irradiating the line for 1 to 30 times repeatedly with a CD-SEM (Model "S-9200", manufactured by Hitachi High-Technologies Corporation).

EXAMPLE 1

An 8-inch silicon wafer was applied with a coating solution for forming an anti-reflection coating film ("ARC-29A", a product of Brewer Science, Inc.) followed by a heat treatment at 215° C for 60 seconds to form an anti-reflection coating film with a film thickness of 77 nm which is applied with a photoresist composition ("TARF-P6111", a product of Tokyo Ohka Kogyo Co.) followed by a heat treatment at 130° C. for 90 seconds to form a photoresist layer with a film thickness of 460 nm.

The substrate having the photoresist layer formed thereon was light-exposed to an exposure light with a wavelength of 193 nm on an ArF excimer laser stepper (Model "NSR-S302A", manufactured by Nikon Corporation), through a patterned photomask having a line-and-space pattern of 130 nm followed by a heat treatment at 130° C. for 90 seconds.

Subsequently, the photoresist layer was subjected to a development treatment with a 2.38% by mass aqueous solution of tetramethylammonium hydroxide at 23° C. for 60 seconds to form a patterned resist layer having a line-and-space pattern of 130 nm.

Subsequently, a rinse solution was prepared which is a 100 ppm aqueous solution of imidazoline, and was applied on the surface of the above-described patterned resist layer at 2,000 rpm for seven seconds to perform a rinse treatment.

The number of defects on the patterned resist layer formed in this way was measured with the use of a surface defect observation instrument (which was previously described) to find that the reduction ratio of the defects was about 6%.

EXAMPLE 2

Lithographic rinse solutions (I), (II) and (III) were prepared by adding, to a 0.1% by mass aqueous solution of polyvinylpyrrolidone (with a mass average molecular weight of 10,000), imidazoline in a concentration of 25 ppm, 50 ppm or 100 ppm on the basis of the total mass, respectively, followed by stirring.

EXAMPLE 3

A silicon wafer was applied with a coating solution for forming an anti-reflection coating film (previously described) followed by a heat treatment at 215° C. for 60 seconds to form an anti-reflection coating film with a film thickness of 77 nm which is applied with a photoresist composition (previously described) followed by a heat treatment at 130° C. for 90 seconds to form a photoresist layer with a film thickness of 460 nm.

The substrate having the photoresist layer formed thereon was light-exposed to an exposure light with a wavelength of 193 nm on an ArF excimer laser stepper (previously described), through a patterned photomask having a line-and-space pattern of 130 nm followed by a heat treatment at 130° C. for 90 seconds.

After the light exposure, the photoresist layer was subjected to a development treatment with a 2.38% by mass aqueous solution of tetramethylammonium hydroxide at 23° C. for 60 seconds.

Subsequently, the inventive lithographic rinse solution obtained in Example 2 and a rinse solution containing 0.1% by mass of poly(vinylpyrrolidone) alone and a rinse solution containing 0.1% by mass of poly(vinyl alcohol) alone, which were comparative samples, were applied on the surface of the patterned resist layer obtained in the above-described development treatment followed by a rinse treatment of the patterned resist layer at 500 rpm for 3 seconds and then a further rinse treatment with pure water under the same condition for 20 seconds.

Physical properties of the patterned resist layers which have been rinsed in this way are shown in Table 1.

TABLE 1

| | Physical properties | | |
|---|---|---|---|
| Rinse solutions | Reduced ratio of number of defects, % | Draining period of time, seconds | Electron-beam resistance |
| (I) | 2 | 7 | 118 |
| (II) | 3 | 7 | 119 |
| (III) | 5 | 7 | 121 |
| Poly(vinylpyrrolidone) | 3 | 13 | 108 |
| Poly(vinyl alcohol) | 1 | 21 | 101 |

A method according to the present invention can improve the yield of a product by reducing defects occurring when forming a pattern with the use of a photoresist; keep dimensional controllability high by imparting the photoresist resistance to an electron beam, and by inhibiting the pattern from shrinking due to irradiation with the electron beam; and further prevent pattern-falling by improving the draining of water.

Accordingly, a method according to the present invention can be used in a process for producing a semiconductor device such as LSI and ULSI using a lithographic technology.

What is claimed is:

1. A lithographic rinse solution consisting essentially of:

an unsubstituted water-soluble nitrogen-containing heterocyclic compound selected from the group consisting of oxazole of the formula

 or 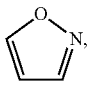

imidazotine of the formula

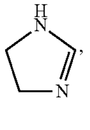, 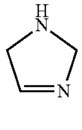 or 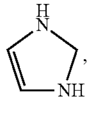, imidazole of the formula

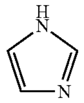

or

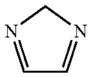

and triazole of the formula

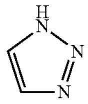

or

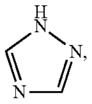

a water-soluble resin, and an aqueous solvent selected from the group consisting of water and a mixed solvent of water and a water-miscible organic solvent, wherein the blending proportion of the nitrogen-containing heterocyclic compound to the water-soluble resin is from 1:10 to 1:40 by mass, and the concentration of the nitrogen-containing heterocyclic compound is in the range from 0.1-50 ppm by mass based on the overall amount of the solution.

2. The lithographic rinse solution as claimed in claim 1 wherein the Unsubstituted water-soluble nitrogen-containing heterocyclic compound is imidazoline.

3. The lithographic rinse solution as claimed in claim 1 wherein the aqueous solvent is a mixed solvent of water and a water-miscible organic solvent.

4. The lithographic rinse solution as claimed in claim 3 wherein the water-miscible organic solvent is an alcoholic or glycolic organic solvent.

5. The lithographic rinse solution as claimed in claim 3 wherein the mixing proportion of the water-miscible organic solvent is in the range from 0.01 to 10% by mass based on the amount of water.

6. The lithographic rinse solution as claimed in claim 1 wherein the amount of the water-soluble resin is in the range from 0.1 ppm by mass to 10% by mass based on the overall amount of the solution.

7. A method for the formation of a patterned resist layer on a substrate which comprises the successive steps of:

(A) forming a layer of a photoresist composition on the surface of the substrate;

(B) selectively exposing the photoresist layer to actinic rays through a patterned photomask;

(C) subjecting the photoresist layer exposed to actinic rays to a post-exposure baking treatment;

(D) developing the photoresist layer after the post-exposure baking treatment with an aqueous alkaline developer solution; and (E) rinsing the alkali-developed photoresist layer with the lithographic rinse solution defined in claim 1 to render the photoresist layer hydrophilic.

8. The method as claimed in claim 7 which further comprises a step of (F) rinsing the developed photoresist layer after the step (E) with pure water.

* * * * *